United States Patent
Hsu et al.

[11] Patent Number: 5,117,197
[45] Date of Patent: May 26, 1992

[54] HIGH-POWER FEED-FORWARD MICROWAVE AMPLIFIER APPARATUS WITH OUT-OF-BAND INTERMODULATION PRODUCT SUPPRESSION

[75] Inventors: Rui T. Hsu, Torrance; Thomas M. Straus, Los Angeles, both of Calif.

[73] Assignee: Hughes Aircraft Company, Los Angeles, Calif.

[21] Appl. No.: 612,166

[22] Filed: Nov. 9, 1990

[51] Int. Cl.$^5$ .............................................. H03F 1/26
[52] U.S. Cl. .................................... 330/149; 330/151
[58] Field of Search .................. 330/149, 151; 328/163

[56] References Cited

U.S. PATENT DOCUMENTS 4,617,522 10/1986 Tarbutton et al. .............. 330/151 X

*Primary Examiner*—James B. Mullins
*Attorney, Agent, or Firm*—Terje Gudmestad; Jeannette M. Walder; W. K. Denson-Low

[57] ABSTRACT

A replica of a microwave input signal is subtracted from an amplified version of the input signal produced by main power amplifiers (52a,52b) to produce an error signal corresponding to distortions introduced into the input signal by the power amplifiers (52a,52b). The error signal is amplified by an error amplifier (30), and subtracted from the amplified input signal to produce an output signal in which the distortions have been canceled. A bandpass filter (54) is provided immediately following the power amplifiers (52a,52b) to suppress or block intermodulation products generated in the power amplifiers (52a,52b) which are outside the bandwidth of the input signal and which could overload the error amplifier (30) to generate further distortion. A second filter (78) may be provided through which the replica signal passes to better match the replica signal to the amplified and filtered input signal. Suppression of the out-of-band intermodulation products enables operation of the power amplifiers (52a,52b) very close to their saturation limit with maximum efficiency. A second error cancellation branch (56,60,62,64,66,68,70,72) may be provided to produce further reduction of distortion, and may include a third bandpass filter (80).

8 Claims, 2 Drawing Sheets

HIGH-POWER FEED-FORWARD MICROWAVE AMPLIFIER APPARATUS WITH OUT-OF-BAND INTERMODULATION PRODUCT SUPPRESSION

BACKGROUND OF THE INVENTION

1. Field of the Invention

The present invention relates to a low distortion, feed-forward microwave amplifier apparatus including an out-of-band intermodulation product suppression arrangement which enables the amplifier to operate with increased power and efficiency.

2. Description of the Related Art

Feed-forward techniques are finding increasing use in a variety of microwave communications systems. A particular application in which feed-forward amplifiers are especially useful is in multichannel amplitude modulated link (AML) transmitters for community antenna television (CATV) systems.

Typical feed-forward amplifier arrangements are designed to cancel distortion introduced by a main power amplifier. Samples of the signal being processed are obtained before and after the main amplifier, and are compared to obtain an error signal. The error signal is amplified in an auxiliary amplifier and combined with the distortion-containing signal from the main amplifier such that cancellation of the distortion components occurs. An additional distortion cancellation stage may be added when improved performance is desired. The basic principles of the feed-forward amplifier arrangement are presented in a paper entitled "A Microwave Feed-Forward Experiment", by H. Seidel, in the Bell System Technical Journal, vol. 50, no. 9, November, 1971, pp. 2879-2916.

A practical feed-forward microwave amplifier apparatus is disclosed by the present inventor in U.S. Pat. No. 4,782,307, entitled "FEED-FORWARD MICROWAVE AMPLIFIER ARRANGEMENT WITH FERRITE TEMPERATURE COMPENSATION", issued Nov. 1, 1988 and assigned to Hughes Aircraft Company, the assignee of the present invention. The basic arrangement of the amplifier is illustrated in FIG. 1. The apparatus is generally designated as 10, and includes a four port directional coupler 12 for receiving a microwave input signal IN at an input port 12b thereof. The input signal IN passes through the coupler 12 to an output port 12d thereof, and further through a variable phase shifter 14 to an input port 16b of a second directional coupler 16. The input signal IN also passes through the coupler 12 to an output port 12c thereof, and further through a variable attenuator 18 to the input of a main power amplifier 20. The coupler 12 has another input port 12a which is connected to a termination 22.

The output of the amplifier 20 is connected to an input port 16a of the directional coupler 16. The output signal from the amplifier 20 passes through the directional coupler 16 to an output port 16c thereof with negligible attenuation, and through a variable phase shifter 24 to an input port 26a of a third directional coupler 26. The output signal from the amplifier 20 also passes through the coupler 16 to an output port 16d thereof, and further through a variable attenuator 28 and an auxiliary or error amplifier 30 to an input port 26b of the coupler 26.

The apparatus 10 provides an output signal OUT with amplified power at an output port 26c of the coupler 26. The coupler 26 has another output port 26d which is connected to a termination 32. The output signal from the phase shifter 24 passes through the coupler 26 to the output port 26c with small attenuation, while the output signal from the amplifier 30 passes through the coupler 26 to the output port 26c with predetermined attenuation.

The directional couplers 12, 16 and 26 may be of conventional construction, with the desired signal attenuation determined by the coupling ratio. The gain of the feedforward amplifier is equal to the coupling ratio of the coupler 16, less the loss between 12b and 16b and the loss between 16c and 26c.

The coupling ratios of the couplers 12 and 16 are selected, and the variable attenuator 18 adjusted, such that the signal attenuation from the input port 12b of the coupler 12 to the output port 16d of the coupler 16, through the attenuator 18, amplifier 20, and coupler 16, is equal to the attenuation from the input port 12b of the coupler 12 to the output port 16d of the coupler 16, through the phase shifter 14 and coupler 16.

The coupling ratios of the couplers 16 and 26 are selected, and the variable attenuator 28 adjusted, such that the signal attenuation from the input port 16a of the coupler 16 to the output port 26c of the coupler 26 (through the attenuator 28, amplifier 30, and coupler 26) is equal to the signal attenuation from the input port 16a of the coupler 16 to the output port 26c of the coupler 26 (through the phase shifter 24 and coupler 26).

The directional coupler 12 samples the input signal IN and feeds a replica of the input signal along the output port 12d to the variable phase shifter 14, which is adjusted to cancel the signal at 16d which proceeds through 12c. The phase shifter 14 and directional coupler 16 in combination constitute a first comparator or subtractor 34 which subtracts the replica signal from the amplified version of the input signal IN which is produced or output at the output of the main power amplifier 20. More specifically, the amplified input signal and inverted replica signal are combined in the directional coupler 16. Due to the phase delay and resulting logical inversion of the replica signal, the signal combination in the coupler 16 results in the replica signal being subtracted from the amplified input signal.

Although the inverted replica signal appearing at the input port 16b of the directional coupler 16 has negligible distortion, the amplified input signal appearing at the input port 16a will include distortions introduced by the amplifier 20. The purpose of the feed-forward arrangement is to eliminate these distortions by cancellation. The amplified input signal passes through the output port 16c of the coupler 16 to the phase shifter 24 with the distortions unaffected. However, due to the equal signal attenuation in the two signal paths from the input port 12b of the coupler 12 to the output port 16d of the coupler 16 as described above, the inverted replica signal will be subtracted from the amplified input signal in the branch of the coupler 16 terminating at the output port 16d, such that the remaining signal at the output port 16d ideally consists of only the distortions.

The signal passing from the output port 16d of the coupler 16 through the attenuator 28 to the error amplifier 30 may be considered as an error signal, since it consists of the distortions or errors introduced into the input signal in the main power amplifier 20. The error signal is amplified in the amplifier 30, and applied to the input port 26b of the coupler 26.

The phase shifter 24 and directional coupler 26 in combination constitute a second comparator or subtractor 36 which subtracts the error signal from the amplified and distorted input signal. More specifically, the amplified input signal and error signal are combined in the directional coupler 26. Due to the phase delay and resulting logical inversion of the amplified input signal in the phase shifter 24, the signal combination in the coupler 26 results in the error signal being subtracted from the amplified input signal.

Microwave systems are expensive, and subject to thermal and mechanical constraints. It is therefore desirable to obtain the highest level of efficiency from each system component. Attempts to optimize the conventional feed-forward amplifier arrangement include providing the error amplifier with a lower power handling capability than the main power amplifier, which is therefore less expensive. This is possible since the amplified error signal has substantially lower power than the amplified input signal. Further attempts at optimization include driving the main power amplifier at as close to its saturation level as possible in order to maximize the output power. However, it has been found that the error amplifier introduces distortions of its own into the error signal when the main amplifier is driven to a very high level such that the associated error signal becomes very large. This effect can become the performance limitation, particularly in feedforward amplifiers utilizing dual cancellation stages.

SUMMARY OF THE INVENTION

The present invention overcomes the limitations inherent in the conventional feed-forward amplifier design by exploiting the realization that the secondary distortions introduced in the error amplifier at high drive power levels partially result from the generation of out-of-band intermodulation products in the main power amplifier. Typically, the input signal will be a multiplexed CATV signal consisting of, for example 80 channels within a bandwidth of 12.7 to 13.2 GHz. The signals in the individual channels mix with each other to produce high order intermodulation products which are outside the bandwidth of the input signal. In the conventional arrangement, these intermodulation products are applied to the error amplifier along with the in-band error signal. At high drive levels, the out-of-band intermodulation products have significant power. If the power handling capability of the error amplifier is too low, or the signal drive level is too high, the error amplifier will be overdriven and introduce additional distortions into the error signal. The out-of-band intermodulation products thereby impose an undesired burden on the error amplifier, especially at high drive power levels, which limits the size reduction of the error amplifier and maximum drive level of the main power amplifier.

The present invention overcomes the problem created by these out-of-band intermodulation products by preventing them from being applied to the error amplifier. More specifically, a replica of a microwave input signal is subtracted from an amplified version of the input signal produced by a main power amplifier to produce an error signal corresponding to distortions introduced into the input signal by the power amplifier which are within the bandwidth of the input signal. The error signal is amplified by an error amplifier, and subtracted from the amplified input signal to produce an output signal in which the distortions have been canceled. A bandpass filter is provided between the power amplifier and the error amplifier to suppress or block intermodulation products generated in the power amplifier which are outside the bandwidth of the input signal and which could overload the error amplifier and thus generate further distortion. Suppression of the out-of-band intermodulation products enables operation of the power amplifier very close to its saturation limit with high efficiency. One or more additional error cancellation branches may be provided to produce further reduction of distortion, and may include additional bandpass filters.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
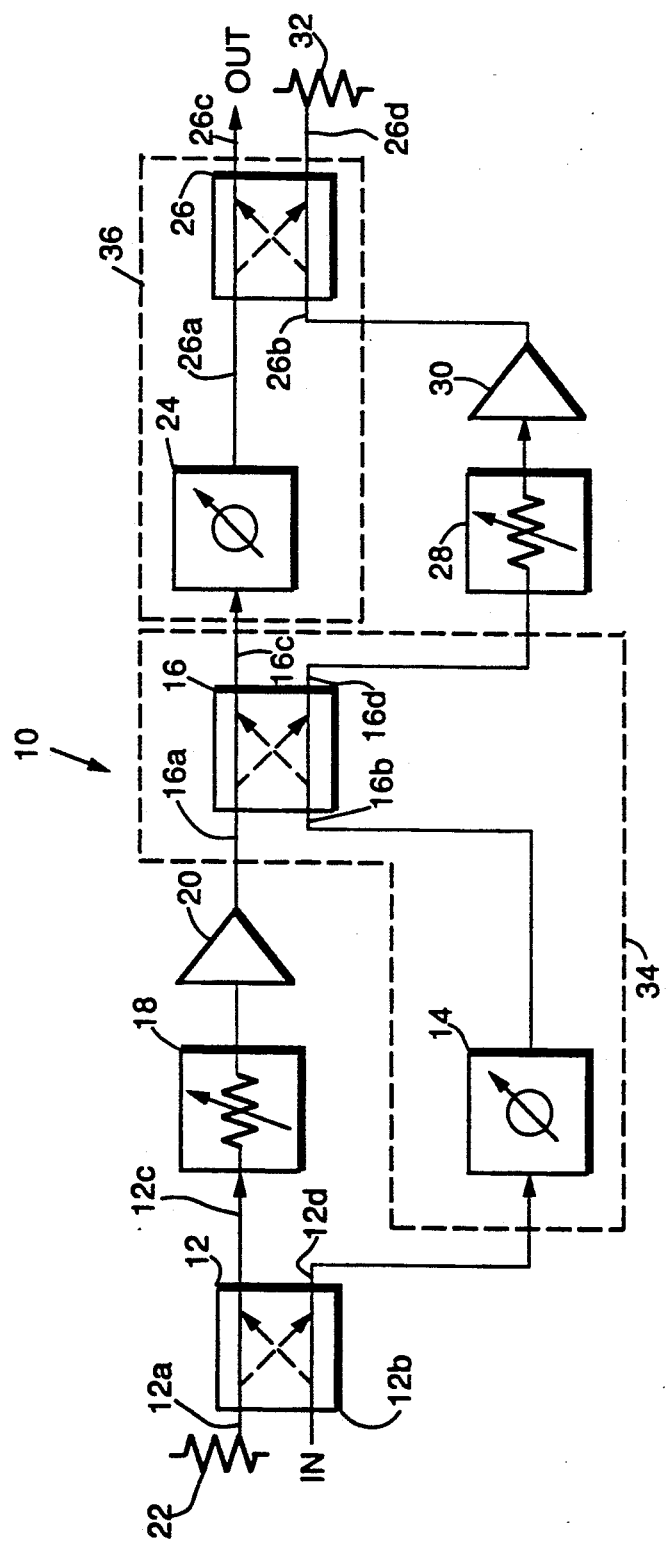
FIG. 1 is a schematic diagram of a conventional feed-forward amplifier apparatus.
Figure 2:
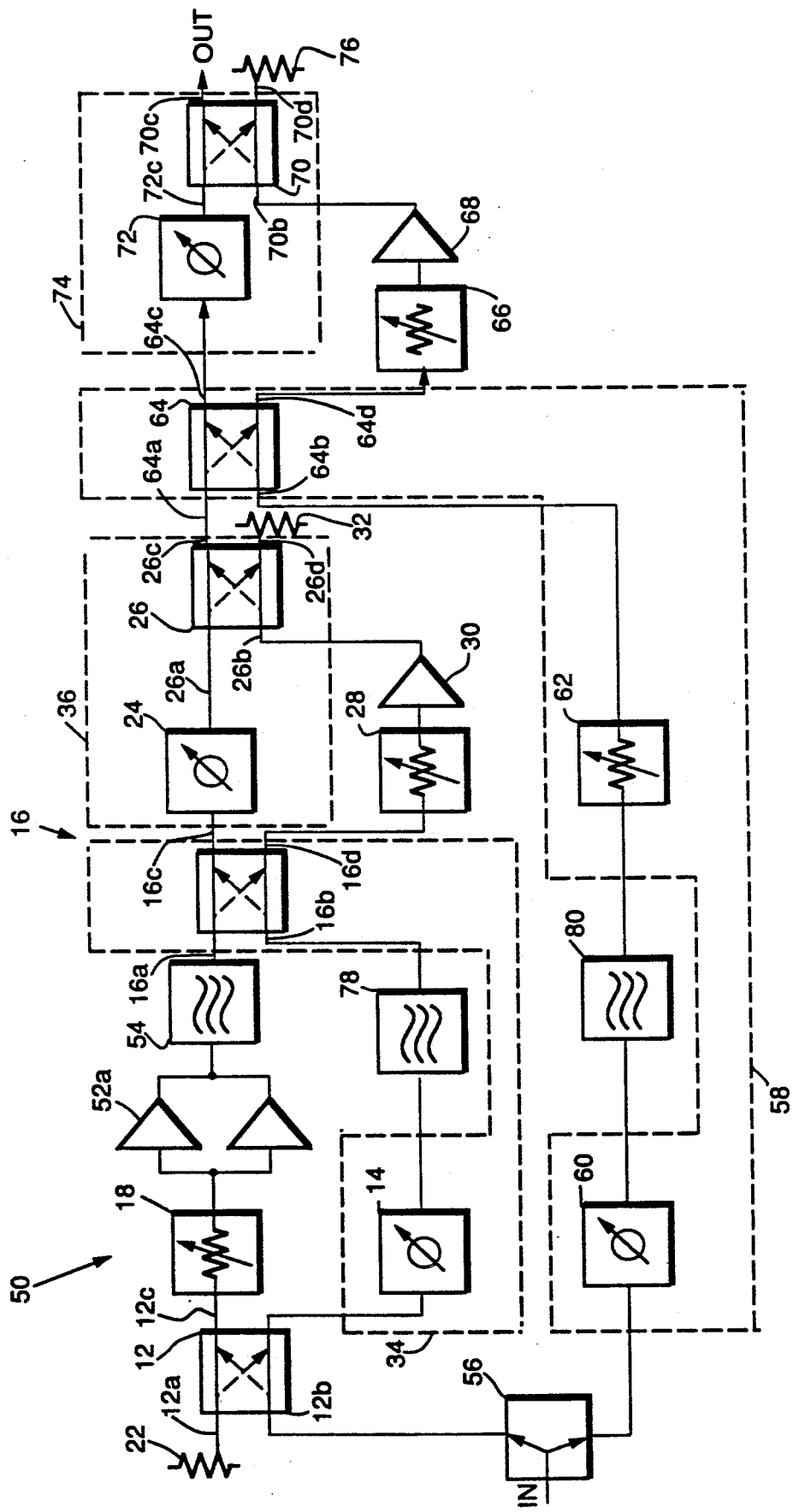
FIG. 2 is a schematic diagram of an improved feed-forward amplifier apparatus embodying the present invention.

A feed-forward amplifier apparatus embodying the present invention is illustrated in FIG. 2, and generally designated as 50. The apparatus 50 includes the elements of the conventional apparatus 10 illustrated in FIG. 1, which are designated by the same reference numerals.

The amplifier 20 may be replaced by two amplifiers 52a and 52b connected in parallel, with each amplifier 52a and 52b having the same power handling capability as the amplifier 20 shown in FIG. 1. The apparatus 50 thereby has twice the power handling capability of the apparatus 10. Alternatively, the two amplifiers 52a and 52b may be replaced with a single amplifier having higher, for example twice, the power handling capability of each individual amplifier 52a and 52b, although not specifically illustrated. The error amplifiers 30 and 68 may have a power handling capability which is lower than that of the combined main power amplifiers 52a and 52b, for example one-half thereof. In this case, the amplifiers 52a, 52b, 30 and 68 may be identical units, thereby simplifying the manufacture of the apparatus 50 by reducing the number of different components which must be provided.

In accordance with an important feature of the present invention, a bandpass filter 54 is provided between the combined outputs of the main power amplifiers 52a and 52b, and the input port 16a of the coupler 16. The bandpass filter 54 has a bandpass which is comparable to the anticipated bandwidth of the input signal IN, and thereby removes out-of-band intermodulation products from the amplified input signal applied to the input port 16a of the coupler 16.

The bandpass filter 54 suppresses and prevents the out-of-band intermodulation products from appearing in the output signal OUT, and further prevents the out-of-band intermodulation products from reaching and overdriving the error amplifier 30. Since the error amplifier 30 is not overdriven by the out-of-band intermodulation products, it will not introduce additional distortions into the error signal. This achieves the present goals of enabling the size of the error amplifier 30 to be reduced, and the input drive level of the amplifiers 52a and 52b to be increased.

The bandpass of the bandpass filter 54 is selected to be comparable, and preferably substantially equal, to the bandwidth of input signal IN. Maximum performance will be attained if the bandpass filter 54 provides sharp attenuation beyond the upper and lower frequency limits of the signal bandwidth. However, the term "substantially equal" should be given considerable latitude within the scope of the present invention. The primary constraint on the bandpass of the filter 54 is that it include the bandwidth of the input signal IN and exclude at least the bulk of the out-of-band intermodulation products.

The bandpass filter 54 may be of any known type which fulfills the design requirements of a particular application. Numerous types of bandpass filters which are suitable for practicing the present invention are described in detail in a textbook entitled "Microwave Filters, Impedance-Matching Networks and Coupling Structures", by G. Matthaei et al, McGraw-Hill 1964, pp. 421-724. For an exemplary CATV signal bandwidth of 12.7 to 13.2 GHz, the bandpass filter 54 may be a conventional obstacle-coupled waveguide cavity filter, which is a coupled resonator filter of the type described in the Matthaei reference on pages 427 to 433, designed to produce an attenuation of 8 dB at frequencies 100 MHz above and below the bandwidth of the input signal.

As further illustrated in FIG. 2, the apparatus 50 may include an additional error cancellation stage or branch to further improve the performance thereof. The general concept of an additional error cancellation stage is known, but not with the out-of-band intermodulation product suppression feature of the present invention. A splitter 56 samples the input signal IN and feeds a second replica signal to a third comparator or subtractor 58 which includes a variable phase shifter 60, an attenuator 62, and a directional coupler 64. The phase-inverted second replica signal is applied to an input port 64b and subtracted in the coupler 64 from the once corrected input signal from the coupler 26 applied to an input port 64a to produce or output a second error signal at an output port 64d which represents residual distortions introduced in the main power amplifiers 52a and 52b, as well as any additional distortions introduced in the error amplifier 30. In the absence of the bandpass filter 54, the out-of-band intermodulation products would be relatively enhanced relative to the in-band intermodulation products in the second error signal since the efficacy of the cancellation of the first error signal is typically bandwidth limited by imperfect amplitude and phase matching. Thus, the filter 54 is particularly useful in avoiding overload of the amplifier 68.

The second error signal is passed through a variable attenuator 66 and second error amplifier 68 to an input port 70b of a directional coupler 70. The once corrected input signal is passed from an output port 64c of the coupler 64 through a phase shifter 72 to an input port 70a of the coupler 70. The phase shifter 72 and coupler 70 in combination constitute a fourth comparator or subtractor 74, which subtracts the second error signal from the once corrected amplified input signal to produce or output a twice corrected output signal at an output port 70c with the residual distortions removed. The attenuator 66 is adjusted so as to attain equal attenuation of the once corrected input signal and the second error signal. Further illustrated is a termination 76 connected to an output port 70d of the coupler 70. Although not illustrated, one or more additional distortion cancellation stages may be added to the configuration of FIG. 2.

In certain applications, the performance of the apparatus 50 may be improved by providing an additional bandpass filter 78 and/or a bandpass filter 80 to ensure a good phase and amplitude match over the full signal band to better replicate the intermodulation-free portion of the amplified and bandpassed signal at 16a. The bandpass filters 78 and 80 should be of the same design as the filter 54, connected in circuit downstream of the phase shifters 14 and 60 as illustrated. Although not shown, the filters 78 and 80 may alternatively be connected upstream of the respective phase shifters 14 and 60.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A feed-forward amplifier apparatus, comprising:
    main amplifier means for amplifying an input signal and producing an amplified input signal;
    replicating means for producing a replica signal corresponding to the input signal;
    first comparison means for comparing the replica signal with the amplified input signal to output an error signal corresponding to distortions introduced into the input signal by the main amplifier means;
    error amplifier means for amplifying the error signal to produce an amplified error signal;
    second comparison means for comparing the amplified error signal with the amplified input signal to output an error corrected signal; and
    bandpass filter means disposed between the main amplifier means and the first comparison means and having a bandpass comparable to the anticipated bandwidth of the input signal.

2. An apparatus as in claim 1, in which the main amplifier means has a higher power capability than the error amplifier means.

3. An apparatus as in claim 1, in which the replicating means further comprises second bandpass filter means having a bandpass comparable to the anticipated bandwidth of the input signal.

4. An apparatus as in claim 1, further comprising:
    second replicating means for producing a second replica signal corresponding to the input signal;
    third comparison means for comparing the second replica signal with the error corrected signal and outputting a second error signal corresponding to residual distortions which remain in the error corrected signal;
    second error amplifier means for amplifying the second error signal to produce a second amplified error signal; and
    fourth comparison means for comparing the second amplified error signal with the error corrected signal to output a second error corrected signal.

5. An apparatus as in claim 4, in which the main amplifier means has a higher power capability than the error amplifier means and the second error amplifier means.

6. An apparatus as in claim 4, in which the replicating means further comprises second bandpass filter means having a bandpass comparable to the anticipated bandwidth of the input signal.

7. An apparatus as in claim 4, in which:
the replicating means further comprises second bandpass filter means having a bandpass comparable to the anticipated bandwidth of the input signal; and
the second replicating means further comprises third bandpass filter means having a bandpass comparable to the anticipated bandwidth of the input signal.

8. In a feed-forward amplifier including a main amplifier for amplifying an input signal having a predetermined bandwidth, error signal generator means for generating an error signal corresponding to distortions introduced into the input signal by the main amplifier means, and error amplifier means for amplifying the error signal, the improvement comprising bandpass filter means connected in circuit between the main amplifier means and the error amplifier for suppressing or blocking intermodulation products generated in the main amplifier which are substantially outside the anticipated bandwidth of the input signal.

* * * * *